(12) United States Patent
Wang et al.

(10) Patent No.: US 11,626,558 B2
(45) Date of Patent: Apr. 11, 2023

(54) SEMICONDUCTOR STRUCTURE AND MANUFACTURING METHOD THEREOF, AND MEMORY

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Xiaoguang Wang, Hefei (CN); Dinggui Zeng, Hefei (CN); Huihui Li, Hefei (CN); Kanyu Cao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 0 days.

(21) Appl. No.: 17/812,549

(22) Filed: Jul. 14, 2022

(65) Prior Publication Data
US 2023/0068461 A1    Mar. 2, 2023

Related U.S. Application Data

(63) Continuation of application No. PCT/CN2022/098429, filed on Jun. 13, 2022.

(30) Foreign Application Priority Data

Sep. 1, 2021 (CN) .......................... 202111022542.5

(51) Int. Cl.
*H01L 43/08* (2006.01)
*H01L 27/22* (2006.01)
(Continued)

(52) U.S. Cl.
CPC .......... *H01L 43/08* (2013.01); *H01L 23/5283* (2013.01); *H01L 27/228* (2013.01);
(Continued)

(58) Field of Classification Search
CPC ... H01L 43/08; H01L 23/5283; H01L 27/228; H01L 29/42392; H01L 29/7869; H01L 29/78696; H01L 43/02; H01L 43/12
(Continued)

(56) References Cited

U.S. PATENT DOCUMENTS 8,830,735 B2  9/2014  Kariyada et al.
9,000,409 B2  4/2015  Huo et al.
(Continued)

FOREIGN PATENT DOCUMENTS

CN    102479541 A    5/2012
CN    102544049 A    7/2012
(Continued)

OTHER PUBLICATIONS

International Search Report cited in PCT/CN2022/077806 dated May 19, 2022, 9 pages.
(Continued)

*Primary Examiner* — Jami Valentine Miller
(74) *Attorney, Agent, or Firm* — Cooper Legal Group, LLC

(57) ABSTRACT

Embodiments of the present disclosure provide a semiconductor structure and a manufacturing method thereof, and a memory. The semiconductor structure may at least include: a plurality of transistors arranged in a staggered manner, wherein the transistors share one source plate, a channel of the transistor is located on the source plate, and a channel length direction of the transistor is perpendicular to a surface of the source plate, and a material of the channel includes an oxide semiconductor; a plurality of drain contact members,
(Continued)

electrically connected to drains of the transistors, wherein an odd number of transistors share one drain contact member, and the transistors sharing the same drain contact member are driven by a same word line; and a plurality of magnetic tunnel junctions, located on the drain contact members, wherein the magnetic tunnel junctions are electrically connected to the drain contact members in a one-to-one corresponding manner.

16 Claims, 5 Drawing Sheets

(51) Int. Cl.
  *H01L 43/02* (2006.01)
  *H01L 29/786* (2006.01)
  *H01L 23/528* (2006.01)
  *H01L 29/423* (2006.01)
  *H01L 43/12* (2006.01)

(52) U.S. Cl.
  CPC .... *H01L 29/42392* (2013.01); *H01L 29/7869* (2013.01); *H01L 29/78696* (2013.01); *H01L 43/02* (2013.01); *H01L 43/12* (2013.01)

(58) Field of Classification Search
  USPC .......................................................... 257/324
  See application file for complete search history.

(56) References Cited

U.S. PATENT DOCUMENTS

| | | |
|---|---|---|
| 9,117,749 B1 | 8/2015 | Or-Bach et al. |
| 10,297,290 B1 | 5/2019 | Beigel et al. |
| 10,446,606 B2 | 10/2019 | Kumar et al. |
| 11,127,783 B2 | 9/2021 | Zhu et al. |
| 11,309,353 B2 | 4/2022 | Goto et al. |
| 2007/0080385 A1 | 4/2007 | Kim et al. |
| 2010/0059837 A1 | 3/2010 | Kim et al. |
| 2010/0289084 A1 | 11/2010 | Yoon et al. |
| 2011/0215382 A1 | 9/2011 | Asao et al. |
| 2012/0241826 A1* | 9/2012 | Satoh .................. H01L 29/7827 257/295 |
| 2014/0138609 A1 | 5/2014 | Satoh et al. |
| 2016/0043136 A1 | 2/2016 | Kim et al. |
| 2016/0233333 A1 | 8/2016 | Toh et al. |
| 2016/0315248 A1* | 10/2016 | Zhu ....................... H01L 27/228 |
| 2018/0269254 A1* | 9/2018 | Sugioka .............. G11C 11/1653 |
| 2019/0088327 A1* | 3/2019 | Ito ....................... H01L 27/2481 |
| 2020/0144330 A1 | 5/2020 | Majhi et al. |

FOREIGN PATENT DOCUMENTS

| | | |
|---|---|---|
| CN | 109461756 A | 3/2019 |
| CN | 110571261 A | 12/2019 |
| CN | 110892531 A | 3/2020 |
| CN | 111816673 A | 10/2020 |
| CN | 212136451 U | 12/2020 |
| CN | 212391999 U | 1/2021 |
| CN | 112349322 A | 2/2021 |
| CN | 112909039 A | 6/2021 |
| CN | 113140588 A | 7/2021 |
| WO | 2017052542 A1 | 3/2017 |
| WO | 2018182724 A1 | 10/2018 |

OTHER PUBLICATIONS

International Search Report cited in PCT/CN2022/077805 dated May 11, 2022, 8 pages.
International Search Report cited in PCT/CN2022/077730 dated Apr. 25, 2022, 9 pages.
International Search Report cited in PCT/CN2022/098429 dated Jul. 27, 2022, 16 pages.

* cited by examiner

US 11,626,558 B2

SEMICONDUCTOR STRUCTURE AND MANUFACTURING METHOD THEREOF, AND MEMORY

CROSS-REFERENCE TO RELATED APPLICATIONS

This is a continuation of International Application No. PCT/CN2022/098429, filed on Jun. 13, 2022, which claims the priority to Chinese Patent Application 202111022542.5, titled "SEMICONDUCTOR STRUCTURE AND MANUFACTURING METHOD THEREOF, AND MEMORY" and filed on Sep. 1, 2021. The entire contents of International Application No. PCT/CN2022/098429 and Chinese Patent Application 202111022542.5 are incorporated herein by reference.

TECHNICAL FIELD

The present disclosure relates to, but is not limited to, a semiconductor structure and a manufacturing method thereof, and a memory.

BACKGROUND

Semiconductor memories are required in most electronic devices for data storage. The semiconductor memory includes a dynamic random access memory (DRAM) and a magnetic random access memory (MRAM). The data storage action requires a certain drive current. However, as the semiconductor devices are miniaturized, the interconnection resistance of adjacent conductors increases as the contact area decreases, and the drive current decreases with the same drive voltage, which makes it impossible to maintain the original drive capability. In addition, if the drive current is maintained at the original level by increasing the voltage supplied by the voltage source, the power consumption of the semiconductor device will be increased.

SUMMARY

An overview of the subject described in detail in the present disclosure is provided below. The overview is not intended to limit the protection scope of the claims.

According to some embodiments of the present disclosure, a first aspect of the embodiments of the present disclosure provides a semiconductor structure, including: a plurality of transistors arranged in a staggered manner, wherein the transistors share one source plate, a channel of the transistor is located on the source plate, and a channel length direction of the transistor is perpendicular to a surface of the source plate, and a material of the channel includes an oxide semiconductor; a plurality of drain contact members, electrically connected to drains of the transistors, wherein an odd number of transistors share one drain contact member, and the transistors sharing the same drain contact member are driven by a same word line; and a plurality of magnetic tunnel junctions, located on the drain contact members, wherein the magnetic tunnel junctions are electrically connected to the drain contact members in a one-to-one corresponding manner.

According to some embodiments of the present disclosure, a second aspect of the embodiments of the present disclosure further provides a memory, which includes the semiconductor structure described in the first aspect.

According to some embodiments of the present disclosure, a third aspect of the embodiments of the present disclosure further provides a method of manufacturing a semiconductor structure, including:

forming a plurality of transistors arranged in a staggered manner, wherein the transistors share one source plate, a channel of the transistor is located on the source plate, and a channel length direction of the transistor is perpendicular to a surface of the source plate, and a material of the channel comprises an oxide semiconductor;

forming a plurality of drain contact members electrically connected to drains of the transistors, wherein an odd number of transistors share one drain contact member, and the transistors sharing the same drain contact member are driven by a same word line; and forming a plurality of magnetic tunnel junctions, located on the drain contact members, wherein the magnetic tunnel junctions are electrically connected to the drain contact members in a one-to-one corresponding manner.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

Figure 1:
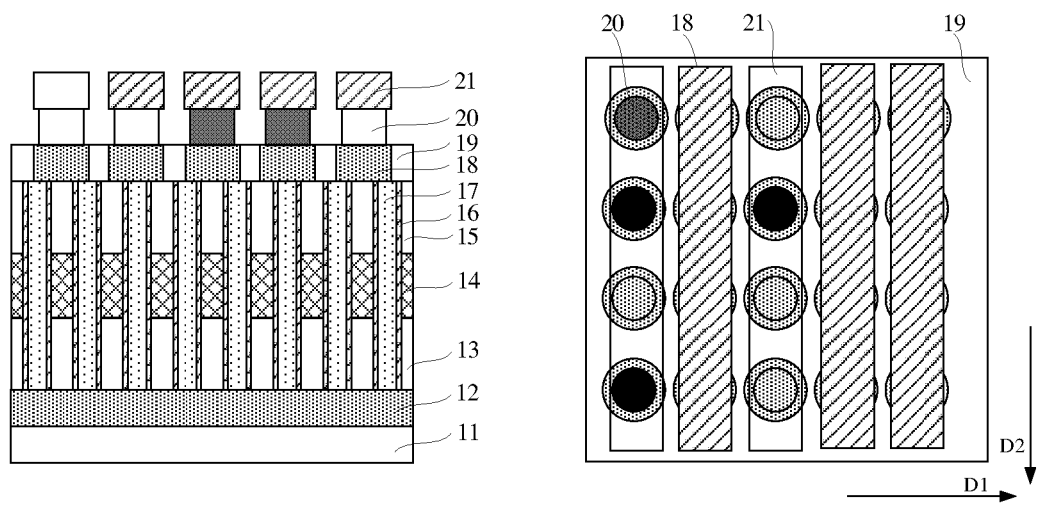
FIG. 1 to FIG. 4 are schematic structural diagrams of a semiconductor structure according to an embodiment of the present disclosure.

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

FIG. 1 to FIG. 4 are schematic structural diagrams of a semiconductor structure according to an embodiment of the present disclosure.

Referring to FIG. 1 to FIG. 4, the semiconductor structure includes: a plurality of transistors arranged in a staggered manner, wherein the transistors share one source plate 12, a channel of the transistor is located on the source plate 12, and a channel length direction of the transistor is perpendicular to a surface of the source plate 12, and a material of the channel includes an oxide semiconductor; a plurality of drain contact members 18, electrically connected to drains of the transistors, wherein an odd number of transistors share one drain contact member 18, and the transistors sharing the same drain contact member 18 are driven by a same word line 14; and a plurality of magnetic tunnel junctions 20, located on the drain contact members 18, wherein the magnetic tunnel junctions 20 are electrically connected to the drain contact members 18 in a one-to-one corresponding manner.

The embodiments of the present application will be described in more detail below with reference to the accompanying drawings. In addition, for the sake of reading fluency, the following descriptions of different film layers or different structures of the semiconductor structure are based on a bottom-up order.

The semiconductor structure includes a substrate 11 and a source plate 12 located on the substrate 11. The substrate 11 may be made of an insulation material, to achieve an isolation function. The substrate 11 may be a flexible substrate or a rigid substrate. The flexible substrate may be made of polyimide, and the rigid substrate may be made of glass. The source plate 12 may be independent of the transistors, and serve as a source contact member to provide a source signal to the transistors, or serve as a source of the transistors to receive a source signal. In any case, the source plate 12 is made of a conductive material, such as at least one of doped polycrystalline silicon, indium tin oxide (ITO), metal molybdenum, metal aluminum, metal titanium and metal copper.

In some embodiments, the word line 14, the gate dielectric layer 16, and the oxide semiconductor layer 17 form the transistor. The gate dielectric layer 16 surrounds the entire sidewall of the oxide semiconductor layer 17. The word line 14 surrounds a part of the oxide semiconductor layer 17 in a thickness direction and a sidewall of a part of the gate dielectric layer 16 in a thickness direction. The part of the oxide semiconductor layer 17 surrounded by the word line 14 is used as a channel of the transistor; a part of the oxide semiconductor layer 17 located between the channel and the source plate 12 is used as a source of the transistor; and another part of the oxide semiconductor layer 17 located at another side of the channel away from the source plate 12 is used as a drain of the transistor. In other words, the gate dielectric layer 16 not only covers the sidewall of the channel of the transistor but also covers sidewall surfaces of the source and drain of the transistor. In other embodiments, the gate dielectric layer is only located between the word line and the channel, that is, the gate dielectric layer only surrounds the sidewall surface of the channel.

It may be understood that, regardless of whether the gate dielectric layer 16 covers the sidewall surfaces of the source and the drain or not, the transistors described above are all vertical gate all around (GAA) transistors, and the term "vertical" means that the channel length direction of the transistor is perpendicular to a plane extension direction of a bottom film layer. In some embodiments, as the size of the semiconductor structure is miniaturized, a distance between adjacent word lines 14 is relatively small, and in this case, the word lines 14 can be formed through reverse self-aligned quadruple patterning.

In some embodiments, the oxide semiconductor material of the oxide semiconductor layer 17 consists of indium gallium zinc oxide (IGZO), and indium gallium zinc oxide consists of $In_2O_3$, $Ga_2O_3$, and $ZnO$. A band gap is approximately 3.5 eV, and the indium gallium zinc oxide may have an amorphous structure. It should be noted that, the oxide semiconductor layer 17 may be made of the oxide semiconductor material only, or mainly made of the oxide semiconductor, that is, other materials serving as subsidiaries or impurities may further be doped in the oxide semiconductor layer 17.

In some embodiments, the gate dielectric layer 16 is made of a high-dielectric-constant material. For example, the material of the gate dielectric layer 16 is selected at least one of $HfO_2$, $ZrO_2$ and HfON. The gate dielectric layer 16 is made of the high-dielectric-constant material, which helps suppress the gate leakage current caused by electron tunneling due to a relatively small thickness of the gate dielectric layer 16.

In some embodiments, the semiconductor structure includes a substrate 11, a source plate 12, a first isolation layer 13, a word line 14, and a second isolation layer 15 that are stacked in sequence. The first isolation layer 13 is arranged between the word line 14 and the source plate 12 to isolate the source plate 12 from the word line 14. The second isolation layer 15 is arranged between adjacent word lines 14 and cover a top surface of the word line 14, and is mainly used to isolate adjacent word lines 14, and isolate the word line 14 from other stacked film layers located on the second isolation layer 15, where other stacked film layers include, but are not limited to, a drain contact member 18.

It may be understood that, a material of the first isolation layer 13 may be the same as or different from a material of the second isolation layer 15. The second isolation layer 15 may consist of a first part and a second part. The first part is arranged between adjacent word lines 14, and the second part is arranged between the word lines 14 and other stacked film layers. A material of the first part may be the same as or different from a material of the second part. For example, a dielectric constant of the material of the first part may be less than that of the material of the second part. The first part is mainly used to suppress signal crosstalk, and the second part is mainly used to prevent shortcircuit.

In addition, the gate dielectric layer 16 and the oxide semiconductor layer 17 sequentially penetrate the second isolation layer 15, the word line 14, and the first isolation layer 13. A bottom of the gate dielectric layer 16 and a bottom of the oxide semiconductor layer 17 are both in direct contact with the surface of the source plate 12. In a direction perpendicular to the surface of the source plate 12, a thickness of the gate dielectric layer 16 and a thickness of the oxide semiconductor layer 17 are equal to a total thickness of the first isolation layer 13, the word line 14, and the second isolation layer 15; the thickness of the gate dielectric layer 16 is greater than a thickness of the channel and a thickness of the word line 14, and the thickness of the word line 14 is equal to the thickness of the channel. In addition, in the direction perpendicular to the surface of the source plate 12, the thickness of the first isolation layer 13 is equal to the thickness of the second isolation layer 15.

Figure 2:
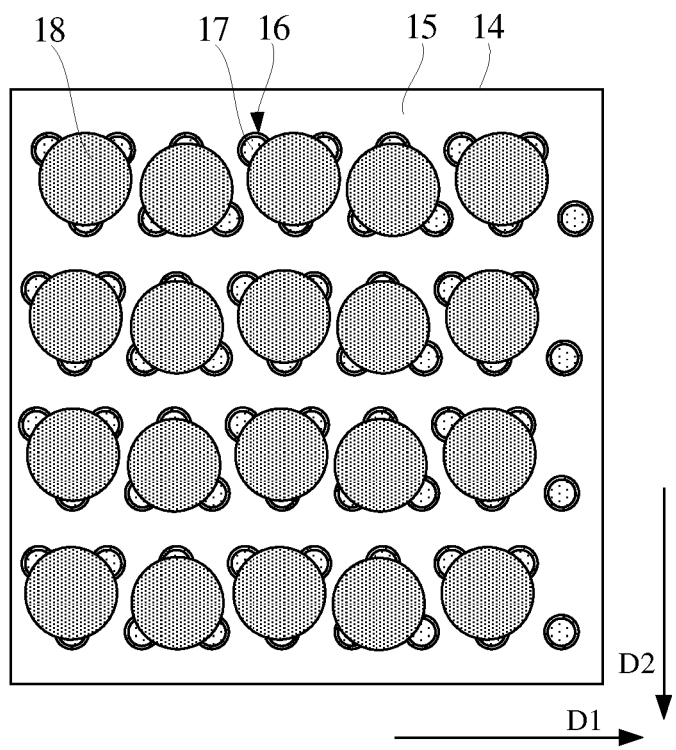

Referring to FIG. 2, the transistors are arranged in an array in a staggered manner, the plurality of word lines 14 extend along a first direction D1, and each word line 14 is connected to transistors in two adjacent rows. An odd number (which is greater than 1) of transistors share one drain contact member 18, and the transistors sharing the same drain contact member 18 are driven by a same word line 14. The transistors sharing the same drain contact member 18 are located in different rows of the transistor array, and an extension direction of the row is the first direction D1.

The transistor array may be considered as an array consisting of different rows extending along the first direction D1 and arranged along a second direction D2. The first direction D1 is perpendicular to the second direction D2.

Transistors in adjacent rows are staggered in the first direction D1, and transistors in rows spaced apart by one row coincide in the first direction D1. Adjacent rows are at an equal interval in the second direction D2. A distance between adjacent transistors in the same row may be equal to a distance between adjacent rows in the second direction D2.

When transistors sharing the same drain contact member 18 are located in different rows of the transistor array, because the transistors need to be driven by the same drive signal, word lines 14 for connecting the transistors in different rows may be interconnected. FIG. 2 is a form of interconnection. In some embodiments, a width of each word line 14 in the second direction D2 is greater than spacing between transistors in different rows in the second direction D2. Each word line 14 surrounds the channels of all the transistors driven by the word line. In other embodiments, each word line drives one row of transistors. In the second direction, the width of each word line is greater than an outer diameter of the gate dielectric layer, and two adjacent word lines are connected outside the transistor array, to share a same drive signal. Compared with turning on transistors in different rows through two drive signals with identical parameters, turning on transistors in different rows through the same drive signal helps avoid a turn-on time difference of transistors caused by a signal timing difference. In other words, it helps ensure transistors in different rows to be turned on at the same moment, thereby implementing effective storage of data signals through a large drive current.

Figure 3:
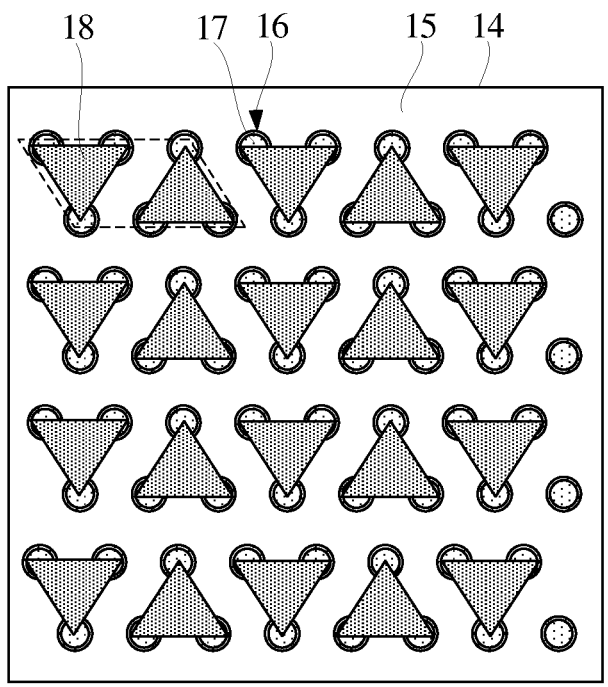

In some embodiments, a combination of any two adjacent drain contact members 18 on the transistors connected to the same word line 14 is in a shape of a parallelogram. An individual drain contact member 18 may be in the shape of a triangle or trapezoid. Referring to FIG. 3, three transistors adjacent to each other share one drain contact member 18, and the drain contact member 18 is in the shape of a triangle; referring to FIG. 4, five transistors share one drain contact member 18, and the drain contact member 18 is in the shape of a trapezoid. It should be noted that, the drain contact member 18 may cover the entire top surface of the drain of each corresponding transistor, or may cover a part of the top surface of the drain of each corresponding transistor.

In some embodiments, the transistors sharing the same drain contact member 18 are located in two adjacent rows in the transistor array. In other embodiments, the transistors sharing the same drain contact member are located in the same row of the transistor array, or located in two rows spaced apart by one row in the transistor array, or located in consecutive n rows in the transistor array, where n is a natural number greater than 2, or located in discontinuous n rows in the transistor array. In other words, transistors sharing the same drain contact member 18 may be determined according to actual requirements; the shape of the drain contact member 18 may be adjusted according to actual requirements, and different drain contact member 18 may have different shapes.

Figure 4:
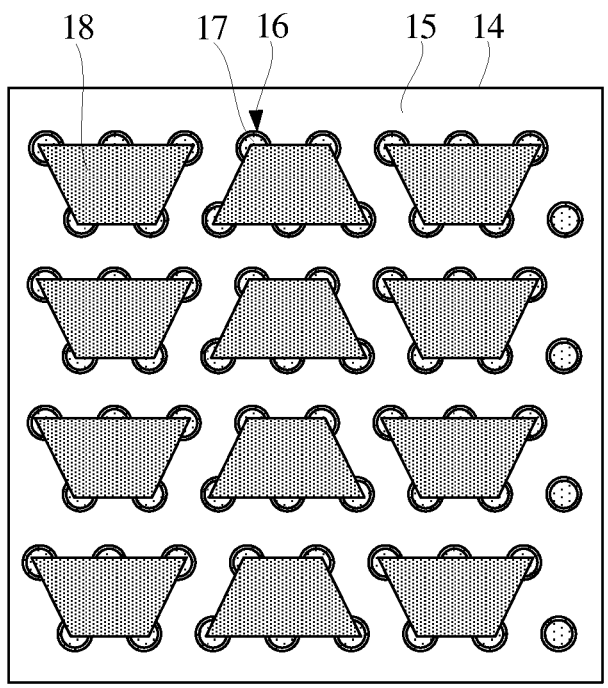

In some embodiments, a plurality of drain contact members 18 are arranged in an array. Referring to FIG. 3 and FIG. 4, the drain contact member 18 is in a shape of a triangle or a trapezoid. In other embodiments, referring to FIG. 2, the drain contact member 18 is in a shape of a circle, and centers of circles of different drain contact members 18 electrically connected to one word line 14 are located in one or two straight lines parallel to the first direction D1. By adjusting the position of the center of circle of the drain contact member 18, the drain contact member 18 covers a larger area of the top surface of each corresponding transistor, thereby reducing the contact resistance and improving the drive current.

In some embodiments, the semiconductor structure further includes: a plurality of bit lines 21 arranged in sequence, where an extension direction of the bit line 21 is perpendicular to an extension direction of the word line 14. Each bit line 21 connects all the magnetic tunnel junctions 20 in the extension direction of the bit line, and the bit line 21 is located above the magnetic tunnel junction 20. By arranging the bit line 21 above the magnetic tunnel junction 20, it helps prevent the cross-sectional size of the bit line 21 from being affected by other structures in the same plane, to ensure a large width of the bit line 21 in the arrangement direction thereof and a large cross-sectional area of the bit line 21 in the extension direction thereof, thereby ensuring low transmission resistance and good signal transmission performance of the bit line 21.

In the foregoing embodiment, the semiconductor structure uses an oxide semiconductor as a channel structure of the transistor. The transistor prepared based on the oxide semiconductor has a high on/off current ratio, which helps improve the on/off characteristic of the transistor. In addition, the drain contact member can be connected to a plurality of transistors, which helps drive the magnetic tunnel junctions with a large drive current without increasing the drive current of the individual transistor, thereby implementing effective storage of data.

An embodiment of the present disclosure further provides a memory, which includes the semiconductor structure described above. The memory prepared based on the foregoing semiconductor structure has lower requirements on the drive voltage and low loss. This helps reduce heating in during operation of the electronic device, thereby reducing the cooling cost of the electronic device and improving the competitiveness of the electronic device.

Figure 5:
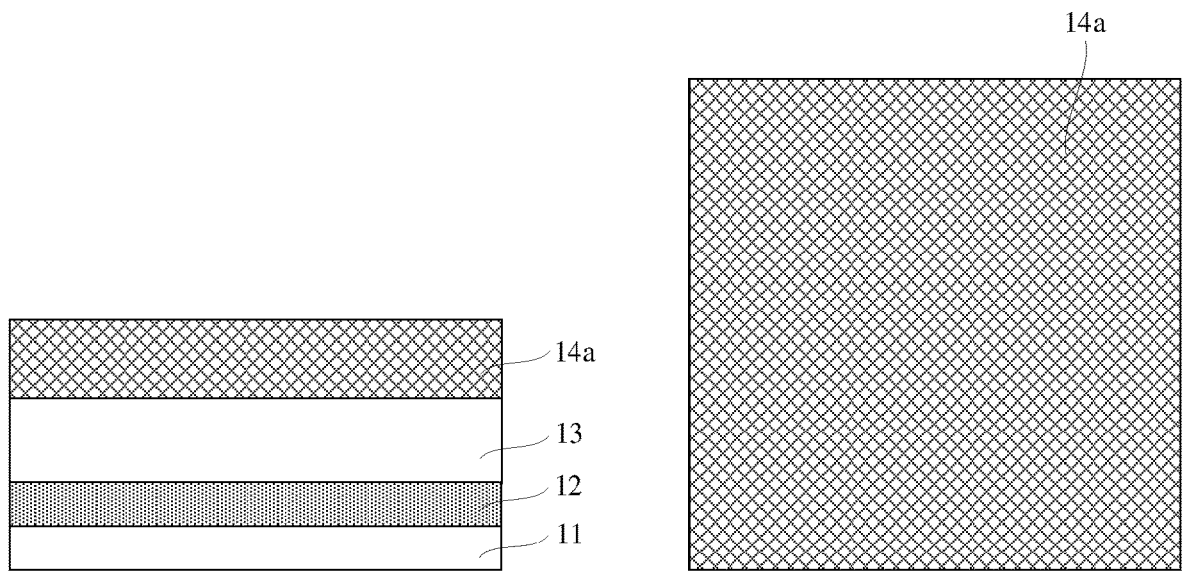
FIG. 5 to FIG. 12 are schematic structural diagrams corresponding to various steps of a method of manufacturing a semiconductor structure according to an embodiment of the present disclosure.

FIG. 5 to FIG. 12 are schematic structural diagrams corresponding to various steps of a method of manufacturing a semiconductor structure according to an embodiment of the present disclosure. Referring to FIG. 5 to FIG. 12, the method of manufacturing a semiconductor structure provided by this embodiment of the present disclosure includes the following steps:

Referring to FIG. 5, a substrate 11, a source plate 12, a first isolation layer 13, and a conductive layer 14a are stacked in sequence.

The substrate 11 may be a support material for supporting formation of subsequent film layers, or may be a combination of all formed film layers, and the substrate 11 is merely used as an example. If the substrate 11 only has a support function, the substrate 11 can be removed after a target structure is formed, or the substrate 11 is not formed. The source plate 12 can be used as a source of a subsequently formed transistor, or provide a source signal for the subsequently formed transistor. The source plate 12 may be made of a conductive material, for example, at least one of doped polycrystalline silicon, indium tin oxide (ITO), metal molybdenum, metal aluminum, metal titanium and metal copper. The first isolation layer 13 is configured to isolate the source plate 12 from the conductive layer 14a; the conductive layer 14a is configured to prepare a word line.

Figure 6:
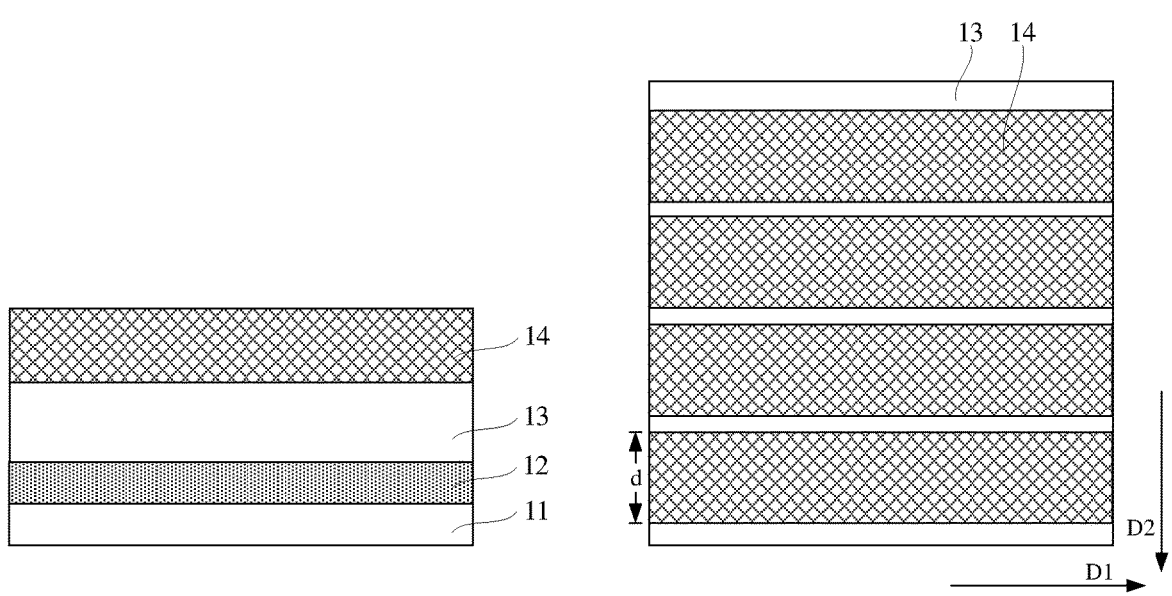

Referring to FIG. 6, the conductive layer 14a (referring to FIG. 5) is etched, and forms a word line 14.

In some embodiments, an extension direction of the word line 14 is a first direction D1, and an arrangement direction of the word line 14 is a second direction D2 perpendicular to the first direction D1. A width d of the word line 14 in the second direction D2 is related to positions and sizes of transistors to be driven by the word line 14. For ease of understanding, the relationship between the width d and the positions and sizes of the transistors is illustrated with reference to the accompanying drawings after the transistors are formed. It may be understood that, before the word line 14 is formed, positions of a plurality of transistors arranged in a staggered manner need to be determined first.

Figure 7:
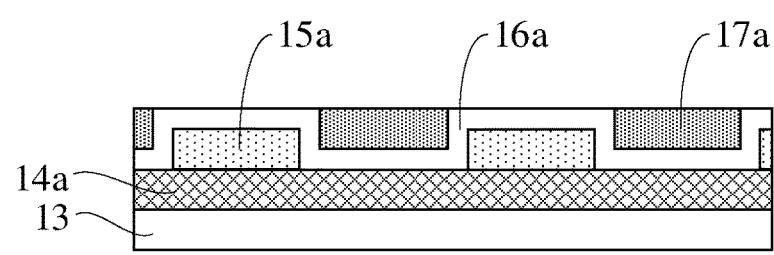
Figure 8:
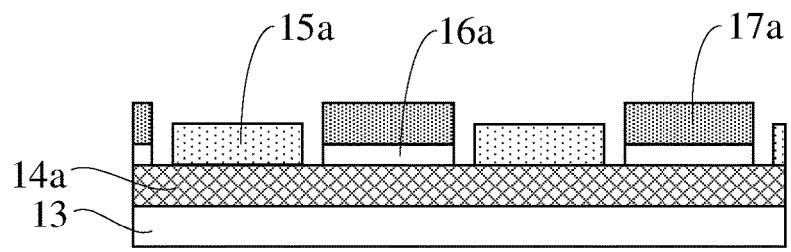

In some embodiments, as the size of the semiconductor structure is miniaturized, a distance between adjacent word lines 14 is relatively small, and a mask with such an opening cannot be formed through a conventional process. In this case, the word line 14 can be formed through a reverse self-aligned quadruple patterning. Specific steps are generally as follows: Referring to FIG. 7, a first mask 15a is first formed on the conductive layer 14a, where the first mask 15a is formed by a plurality of strip-shaped structures arranged in sequence, and a distance between adjacent strip-shaped structures is equal to a distance between two word lines spaced apart by one word line. A sacrificial layer 16a is formed, where the sacrificial layer 16a covers a top surface and a sidewall of the first mask 15a, and covers a surface of the conductive layer 14a. A thickness of the sacrificial layer 16a is equal to a distance between adjacent word lines. The sacrificial layer 16a may be formed through atomic layer deposition, to precisely control the thickness of the sacrificial layer 16a. A second mask 17a is formed, where the second mask 17a fills a groove defined by the sacrificial layer 16a. A material of the second mask 17a may be the same as a material of the first mask 15a. Referring to FIG. 8, the sacrificial layer 16a is etched, to expose a top surface of the conductive layer 14a. In this case, a mask layer formed by the first mask 15a, the remaining sacrificial layer 16a, and the second mask 17a has a relatively small opening spacing. By etching the conductive layer 14a using the opening spacing, word lines 14 with relatively small spacing can be formed.

In other embodiments, before the second mask 17a is formed, the sacrificial layer 16a is etched without a mask through dry etching, to retain only the sacrificial layer 16a covering the sidewall of the first mask 15a and remove the sacrificial layer 16a at other positions. It may be understood that, in whichever manner, the core of the reverse self-aligned quadruple patterning is to form a sacrificial layer through deposition, where a thickness of the sacrificial layer is the same as target opening spacing, and the corresponding sacrificial layer is subsequently removed through etching to form a corresponding mask opening.

Figure 9:
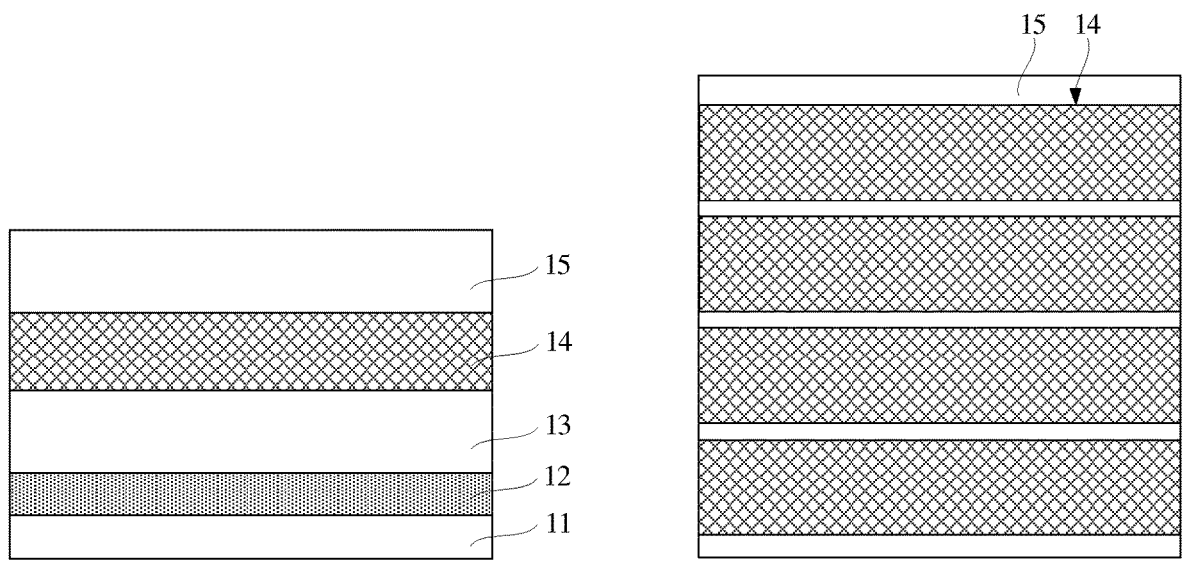

With reference to FIG. 9, a second isolation layer 15 is formed.

A top surface of the second isolation layer 15 is higher than a top surface of the word line 14, and the second isolation layer 15 fills a space between adjacent word lines 14 and covers the top surfaces of the word lines 14. A material of the first isolation layer 13 may be the same as or different from that of the second isolation layer 15. The second isolation layer 15 may consist of a first part and a second part. The first part is arranged between adjacent word lines 14, and the second part is arranged between the word lines 14 and other stacked film layers. A material of the first part may be the same as or different from that of the second part. For example, a dielectric constant of the material of the first part may be less than that of the material of the second part. The first part is mainly used to suppress signal crosstalk, and the second part is mainly used to prevent shortcircuit.

Figure 10:
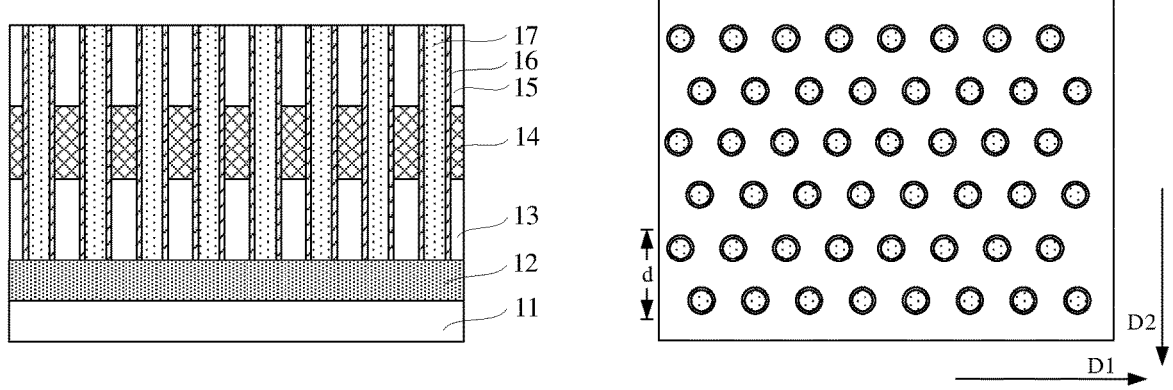

With reference to FIG. 10, a gate dielectric layer 16 and an oxide semiconductor layer 17 are formed.

In some embodiments, the gate dielectric layer 16 and the oxide semiconductor layer 17 sequentially penetrate the second isolation layer 15, the word line 14, and the first isolation layer 13. The bottom of the gate dielectric layer 16 and the bottom of the oxide semiconductor layer 17 are both in direct contact with the surface of the source plate 12. The word line 14 surrounds a part of the oxide semiconductor layer 17 in a thickness direction and covers a sidewall of a part of the gate dielectric layer 16 in a thickness direction. The word line 14, the gate dielectric layer 16, and the oxide semiconductor layer 17 form a transistor. A part of the oxide semiconductor layer 17 that is surrounded by the word line 14 is used as a channel of the transistor, a part of the oxide semiconductor layer 17 located between the channel and the source plate 12 is used as a source of the transistor, and another part of the oxide semiconductor layer 17 located at another side of the channel away from the source plate 12 is used as a drain of the transistor.

The gate dielectric layer 16 and the oxide semiconductor layer 17 may be formed through the following process steps: performing patterned etching to form an opening that sequentially penetrating the second isolation layer 15, the word line 14, and the first isolation layer 13; performing a deposition process to form the gate dielectric layer 16 that covers a sidewall surface of the opening, where a part of the gate dielectric layer 16 that covers the surface of the source plate 12 and the surface of the second isolation layer 15 can be removed through dry etching without a mask; and performing another deposition process to form the oxide semiconductor layer 17 that fills the opening.

In other embodiments, the gate dielectric layer only surrounds the channel of the transistor but does not surround the source and drain of the transistor, and process steps of forming the transistor include: perform patterned etching, to form an opening sequentially penetrating the second isolation layer, the word line, and the first isolation layer; forming a first oxide semiconductor layer that fills the opening, where a bottom surface of the first oxide semiconductor layer is in direct contact with the source plate, and a top surface of the first oxide semiconductor layer is flush with a bottom surface of the word line; forming a gate dielectric film, where the gate dielectric film covers a sidewall and a bottom surface of the opening, and covers a top surface of the second isolation layer; removing the gate dielectric film covering a bottom surface of the opening and located on a top surface of the word line, where the remaining gate dielectric film is used as the gate dielectric layer; and forming a second oxide semiconductor layer that fills the opening, where the second oxide semiconductor layer and the first oxide semiconductor layer jointly form the oxide semiconductor layer.

In some embodiments, the transistors are arranged in an array in a staggered manner. The transistor array may be considered as an array consisting of different rows extending along the first direction D1 and arranged along a second direction D2. The first direction D1 is perpendicular to the second direction D2. Transistors in adjacent rows are staggered in the first direction D1, and transistors in rows spaced apart by one row coincide in the first direction D1. The plurality of word lines 14 extend along the first direction D1, and each word line 14 is connected to transistors in two adjacent rows. If each word line 14 needs to be connected to transistors in two adjacent rows, in the second direction D2, a width d of each word line 14 is required to be at least greater than spacing between adjacent rows of transistors. If each word line 14 needs to surround channels of the corresponding transistors, the width d of each word line 14 is required to be at least greater than a sum of spacing between adjacent rows of transistors and twice the outer diameter of the gate dielectric layer 16.

Figure 11:
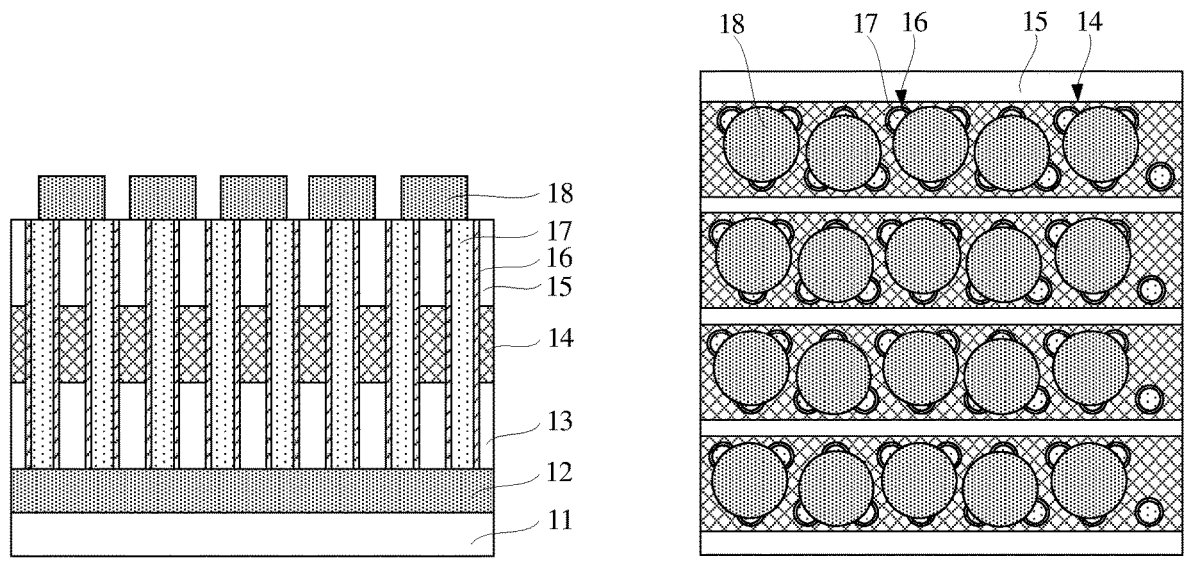

With reference to FIG. 11, drain contact members 18 are formed.

In some embodiments, the drain contact member 18 is in a shape of a circle, and three adjacent transistors in a shape of a triangle share one drain contact member 18. The drain contact member 18 is used as a memory node of the semiconductor structure. In other embodiments, the drain contact member may alternatively be in other shapes, such as triangle and trapezoid, and the number of transistors sharing one drain contact member 18 may alternatively be an odd number such as 5 and 7. In addition, in some embodiments, the transistors sharing the same drain contact member 18 are driven by a same word line 14, or driven by different word lines 14 sharing one drive signal. It should be noted that, different drive signals with identical parameters do not belong to the scope of "one drive signal".

In some embodiments, the drain contact member 18 may be made of a conductive material such as tungsten. During setting of the material of the drain contact member 18, a contact area between the drain contact member 18 and the drain of the transistor as well as the material of the drain of the transistor need to be considered, such that the contact resistance between the drain contact member 18 and the drain of the transistor is relatively small, to ensure that a relatively large drive current flows through the drain contact member 18, thereby implementing data storage effectively.

Figure 12:
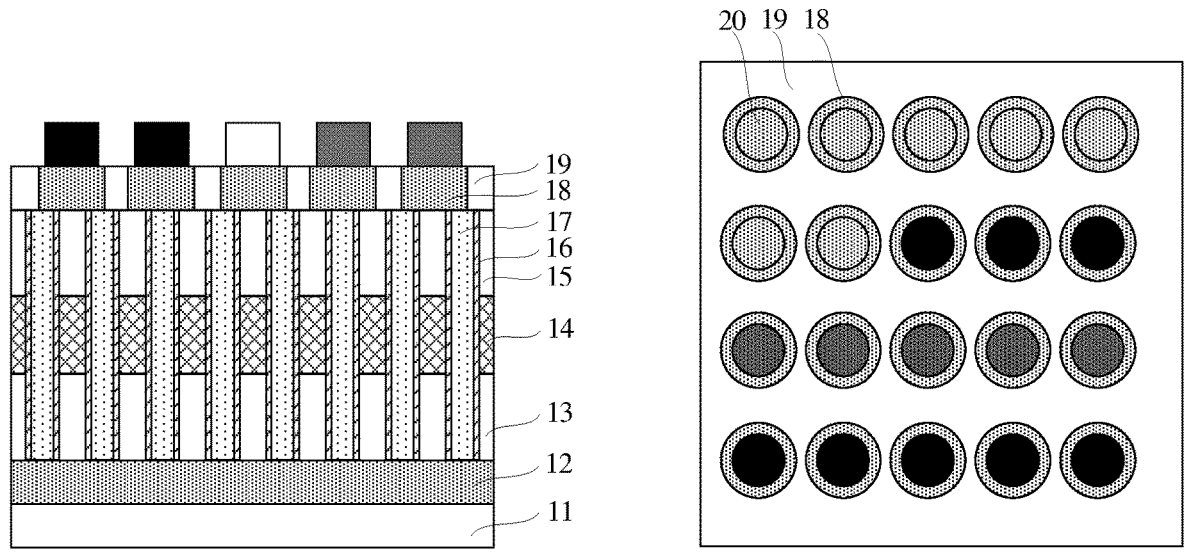

With reference to FIG. 12, a third isolation layer 19 and magnetic tunnel junctions 20 are formed.

The third isolation layer 19 is arranged between adjacent drain contact members 18, to isolate the adjacent drain contact members 18. The magnetic tunnel junctions 20 are located on the drain contact members 18, to implement data storage. The magnetic tunnel junctions 20 are electrically connected to the drain contact members 18 in a one-to-one manner. For example, shapes of the magnetic tunnel junction 20 and the drain contact member 18 may be the same or different. In a direction perpendicular to the surface of the source plate 12, a center of the magnetic tunnel junction 20 and a center of the drain contact member 18 may coincide with each other or be staggered from each other.

For example, in the direction perpendicular to the surface of the source plate 12, the magnetic tunnel junction 20 includes a fixed layer, a tunnel junction, and a free layer in sequence. The fixed layer covers the surface of the drain contact member 18. The fixed layer and the free layer may be made of a ferromagnetic material with planar magnetic anisotropy or vertical magnetic anisotropy. The magnetic orientation of the fixed layer remains unchanged. When the magnetic orientations of the free layer and the fixed layer are anti-parallel (AP), a first state (such as logic "1") is stored. When the magnetic orientations of the free layer and the fixed layer are parallel (P), a second state (such as logic "0") is stored. The relationship between the magnetic orientations of the free layer and the fixed layer can be determined by detecting a resistance when the current flows through the magnetic tunnel junctions 20, thereby reading data. Correspondingly, transistors can be turned on by activating the word line 14, to generate a writing current flowing through the magnetic tunnel junctions 20 (i.e., the foregoing drive current), where the writing current can adjust the magnetic orientation of the free layer to implement data storage.

With reference to FIG. 1, bit lines 21 are formed.

An extension direction of the bit line 21 is perpendicular to an extension direction of the word line 14. An arrangement direction of the bit lines 21 is perpendicular to an arrangement direction of the word lines 14. The bit line 21 is located above the magnetic tunnel junction 20. By arranging the bit line 21 above the magnetic tunnel junction 20, it helps prevent the size of the bit line 21 from being affected by other function structures in the same plane, to ensure a large width of the bit line 21 in the arrangement direction thereof and a large cross-sectional area of the bit line 21 in the extension direction thereof, thereby ensuring good signal transmission performance of the bit line 21.

It may be understood that, before the bit line 21 is formed, a fourth isolation layer (not shown in the figure) may further be provided. The fourth isolation layer is arranged between adjacent magnetic tunnel junctions 20, to isolate the adjacent magnetic tunnel junctions 20 and support the bit line 21.

In the foregoing embodiment, the semiconductor structure uses an oxide semiconductor as a channel structure of the transistor. The transistor prepared based on the oxide semiconductor has a high on/off current ratio, which helps improve the on/off characteristic of the transistor. In addition, the drain contact member can be connected to a plurality of transistors, which helps drive the magnetic tunnel junctions with a large drive current without increasing the drive current of the individual transistor, thereby implementing effective storage of data.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or exam ple(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure.

Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and the manufacturing method thereof, and a memory provided by the embodiments of the present embodiment, the semiconductor structure uses an oxide semiconductor as a channel structure of the transistor. The transistor prepared based on the oxide semiconductor has a high on/off current ratio, which helps improve the on/off characteristic of the transistor. In addition, the drain contact member can be connected to a plurality of transistors, which helps drive the magnetic tunnel junctions with a large drive current without increasing the drive current of the individual transistor, thereby implementing effective storage of data.

The invention claimed is:

1. A semiconductor structure, comprising:
a plurality of transistors arranged in a staggered manner, wherein the transistors share one source plate, a channel of the transistor is located on the source plate, and a channel length direction of the transistor is perpendicular to a surface of the source plate, and a material of the channel comprises an oxide semiconductor;
a plurality of drain contact members, electrically connected to drains of the transistors, wherein an odd number of transistors share one drain contact member, and the transistors sharing the same drain contact member are driven by a same word line; and
a plurality of magnetic tunnel junctions, located on the drain contact members, wherein the magnetic tunnel junctions are electrically connected to the drain contact members in a one-to-one corresponding manner.

2. The semiconductor structure according to claim 1, wherein the oxide semiconductor comprises indium gallium zinc oxide.

3. The semiconductor structure according to claim 2, wherein the transistor further comprises a gate dielectric layer, the gate dielectric layer is located between the word line and the channel and surrounds the channel, and a material of the gate dielectric layer comprises at least one of $HfO_2$, $ZrO_2$ or HfON.

4. The semiconductor structure according to claim 3, wherein in a direction perpendicular to the surface of the source plate, a thickness of the gate dielectric layer is greater than a thickness of the channel and a thickness of the word line.

5. The semiconductor structure according to claim 3, wherein a bottom of the gate dielectric layer is in direct contact with the surface of the source plate.

6. The semiconductor structure according to claim 1, wherein the transistors are arranged in an array in the staggered manner, a plurality of word lines extend along a first direction, and each word line is connected to the transistors in two adjacent rows.

7. The semiconductor structure according to claim 6, wherein the word lines are arranged along a second direction perpendicular to the first direction, a width of each word line in the second direction is greater than a width of the neighboring transistor in the second direction, and each word line surrounds the channels of all the transistors driven by the word line.

8. The semiconductor structure according to claim 6, wherein a combination of any two adjacent drain contact members on the transistors connected to the same word line is in a shape of a parallelogram.

9. The semiconductor structure according to claim 8, wherein three transistors share the same drain contact member, and the drain contact member is in a shape of a triangle.

10. The semiconductor structure according to claim 8, wherein five transistors share the same drain contact member, and the drain contact member is in a shape of a trapezoid.

11. The semiconductor structure according to claim 1, wherein a material of the source plate comprises at least one of indium tin oxide, molybdenum, aluminum, titanium or copper.

12. The semiconductor structure according to claim 1, further comprising: a plurality of bit lines arranged in sequence, wherein an extension direction of the bit line is perpendicular to an extension direction of the word line, the bit line connects all the magnetic tunnel junctions in the extension direction of the bit lines, and the bit line is located above the magnetic tunnel junction.

13. The semiconductor structure according to claim 1, wherein the word line is formed through a reverse self-aligned quadruple patterning.

14. A memory, comprising the semiconductor structure according to claim 1.

15. A method of manufacturing a semiconductor structure, comprising:
forming a plurality of transistors arranged in a staggered manner, wherein the transistors share one source plate, a channel of the transistor is located on the source plate, and a channel length direction of the transistor is perpendicular to a surface of the source plate, and a material of the channel comprises an oxide semiconductor;
forming a plurality of drain contact members electrically connected to drains of the transistors, wherein an odd number of transistors share one drain contact member, and the transistors sharing the same drain contact member are driven by a same word line; and
forming a plurality of magnetic tunnel junctions, located on the drain contact members, wherein the magnetic tunnel junctions are electrically connected to the drain contact members in a one-to-one corresponding manner.

16. The method of manufacturing the semiconductor structure according to claim 15, wherein process steps of forming the transistor comprise:
forming a first isolation layer and a conductive layer that are sequentially stacked on the source plate;

etching the conductive layer, and forming a plurality of word lines arranged in sequence;

forming a second isolation layer, wherein the second isolation layer fills a space between adjacent word lines and covers a top surface of the word line;

sequentially etching the second isolation layer, the conductive layer, and the first isolation layer, and forming a via hole exposing the source plate;

forming a gate dielectric layer, wherein the gate dielectric layer covers a sidewall of the via hole; and depositing the oxide semiconductor to fill the via hole, wherein a part of the oxide semiconductor surrounded by the word line is used as a channel, the oxide semiconductor located between the channel and the source plate is used as a source, and the oxide semiconductor located at a side of the channel away from the source plate is used as a drain.

* * * * *